(12) United States Patent
Kaloyeros et al.

(10) Patent No.: US 6,346,477 B1
(45) Date of Patent: Feb. 12, 2002

(54) METHOD OF INTERLAYER MEDIATED EPITAXY OF COBALT SILICIDE FROM LOW TEMPERATURE CHEMICAL VAPOR DEPOSITION OF COBALT

(75) Inventors: Alain E. Kaloyeros, Slingerlands, NY (US); Ana Londergan, Campbell, CA (US); Barry Arkles, Dresher, PA (US)

(73) Assignee: Research Foundation of SUNY - New York, Albany, NY (US)

( * ) Notice: Subject to any disclaimer, the term of this patent is extended or adjusted under 35 U.S.C. 154(b) by 0 days.

(21) Appl. No.: 09/757,201

(22) Filed: Jan. 9, 2001

(51) Int. Cl.$^7$ .............................................. H01L 21/44
(52) U.S. Cl. ...................... 438/680; 438/682; 438/683
(58) Field of Search .............................. 438/680, 682, 438/683

(56) References Cited

U.S. PATENT DOCUMENTS

| | | | |
|---|---|---|---|
| 4,378,628 A | 4/1983 | Levinstein et al. | 29/571 |
| 4,814,294 A | 3/1989 | West et al. | 437/200 |
| 5,045,496 A | 9/1991 | Hess et al. | 437/81 |
| 5,047,367 A | 9/1991 | Wei et al. | 437/200 |
| 5,356,837 A | 10/1994 | Geiss et al. | 437/200 |
| 5,449,642 A | * 9/1995 | Tan et al. | 438/682 |
| 5,536,684 A | 7/1996 | Dass et al. | 437/201 |
| 5,567,651 A | 10/1996 | Berti et al. | 437/200 |
| 5,736,461 A | 4/1998 | Berti et al. | 438/651 |
| 5,874,342 A | 2/1999 | Tsai et al. | 438/301 |
| 5,902,129 A | 5/1999 | Yoshikawa et al. | 438/592 |
| 5,904,564 A | 5/1999 | Park | 438/683 |
| 5,989,988 A | * 11/1999 | Linuma et al. | 438/682 |
| 6,022,457 A | 2/2000 | Huang et al. | 204/192.17 |

OTHER PUBLICATIONS

A.R. Ivanova et al., "The Effects of Processing Parameters in the Chemical Vapor Deposition of Cobalt from Cobalt Tricarbonyl Nitrosyl", Journal of The Electrochemical Society, 146(6), (1999), pp. 2139–2145.

Rhee et al., "Cobalt Metallorganic Chemical Vapor Deposition and Formation of Epitaxial CoSi2 Layer on Si(100) Substrate", Journal of The Electrochemical Society, 146(6), (1999), pp. 2720–2724.

\* cited by examiner

*Primary Examiner*—John F. Niebling
*Assistant Examiner*—Lynne Gurley
(74) *Attorney, Agent, or Firm*—Heslin Rothenberg Farley & Mesiti P.C.

(57) ABSTRACT

A process for the preparation of cobalt disilicide films comprises chemical vapor deposition (CVD) of cobalt from cobalt tricarbonyl nitrosyl as cobalt source precursor, capping the cobalt layer and annealing to form epitaxial cobalt disilicide on the silicon substrate.

33 Claims, 13 Drawing Sheets

1 μm

METHOD OF INTERLAYER MEDIATED EPITAXY OF COBALT SILICIDE FROM LOW TEMPERATURE CHEMICAL VAPOR DEPOSITION OF COBALT

FIELD OF THE INVENTION

The invention relates to the formation of epitaxial cobalt disilicide layers on silicon substrates using a process based on chemical vapor deposition (CVD) of cobalt.

BACKGROUND OF THE INVENTION

Due to the demand for faster processing speeds in integrated circuits, the size of features in these circuits has been steadily shrinking. However, as device dimensions are scaled down, increasingly stringent requirements are being placed on the properties and performance of the materials used. For example, the gate length and source/drain junction depth of transistors has been reduced, although the reduction in size causes an increase in resistance. A process termed 'self-aligned silicide,' abbreviated to 'salicide,' is typically used to produce features having acceptable resistance. In a salicide process, a metal is deposited over a metal-oxide-semiconductor (MOS) structure, and reacts with the exposed silicon and polysilicon to form a metal silicide. The unreacted metal is then removed from the MOS structure with a selective etch. In typical processes, the selective etch leaves the silicide over the source/drain regions and on the gates. Since the silicide layer has been formed without using a mask, the process is termed 'self-aligned.' Titanium silicide ($TiSi_2$) is widely used for salicide functions in logic devices. Tungsten silicide ($WSi_2$) has also been used, in particular, for gate applications in dynamic random access memory (DRAM) products. Cobalt disilicide ($CoSi_2$) is a particularly promising material for salicide applications, having properties such as low resistivity, low silicon consumption, and high thermal and chemical stability. Additionally, cobalt disilicide provides the advantage that its properties are independent of feature size and type of silicon dopant. Epitaxial cobalt disilicide is even more highly desirable, given the sharpness of the interface between a cobalt disilicide layer and a silicon substrate, which enables the formation of silicided shallow junctions with low contact resistance and low leakage characteristics. Furthermore, agglomeration is dramatically reduced in the absence of grain boundaries, resulting in superior thermal stability.

An interlayer mediated epitaxy (IME) process is commonly used for growing epitaxial cobalt disilicide. It involves forming an interfacial layer between the silicon substrate and a pure cobalt layer. The process typically uses a titanium interlayer, and is, therefore, called titanium interlayer mediated epitaxy (TIME). Typical TIME processing flow has been described by Wei et al. (U.S. Pat. No. 5,047,367). A titanium layer is initially formed over the silicon substrate by a physical vapor deposition (PVD) method. A cobalt layer is then deposited over the titanium, again by PVD. A first annealing step causes the cobalt and titanium to intermix at about 300° C. In a second annealing step, at a higher temperature, intermixing is followed by epitaxial growth of cobalt disilicide, with the titanium being driven to the surface of the resulting cobalt disilicide phase. The titanium surface layer is removed by etching. Other metals, including germanium and tantalum, have also been employed as an interfacial barrier between cobalt and silicon.

The IME and TIME processes are particularly attractive because of compatibility with standard metal-oxide-semiconductor (CMOS) device fabrication flow. However, because the introduction of a reaction barrier interlayer requires additional deposition and etching process steps, there is a need for an improved method for the in situ formation of the interfacial and cobalt layer as one unified growth process. In addition, chemical vapor deposition (CVD) processes have an advantage over so-called 'line of sight' processes such as PVD in the fabrication of semiconductor devices because conformal layers of metals are more easily produced. Therefore, it is desirable that the improved method utilize a CVD process for deposition of the interlayer and cobalt layer.

CVD processes for the deposition of cobalt and cobalt disilicide are known. Ivanova et. al. have disclosed a CVD process for the formation of cobalt films from cobalt tricarbonyl nitrosyl, $Co(CO)_3NO$ (J. Electrochem. Soc., 146, 2139–2145 (1999)). The formation of cobalt disilicide was not disclosed. West et al. (U.S. Pat. No. 4,814,294) have described the use of a cobalt source precursor along with silane as a silicon source precursor for the deposition of cobalt disilicide. Dicobalt octacarbonyl, $Co_2(CO)_8$ and cobalt tricarbonyl nitrosyl $Co(CO)_3No$ are named as suitable cobalt source precursors. The cobalt disilicide deposited was polycrystalline rather than epitaxial; the deposition of pure cobalt films is not disclosed. Rhee et al. have reported a CVD approach for the growth of epitaxial $CoSi_2$ through a two step process which involved, in a first step, the deposition of a Co—C film through the CVD decomposition of the cobalt source dicobalt octacarbonyl, $Co_2(CO)_8$, or cyclopentadienyl-cobalt dicarbonyl, $C_5H_5CO(CO)_2$ (J. Electrochem. Soc., 146, 2720 (1999)). This was followed, in a second step, by an ex-situ thermal annealing step at 800° C. to form the epitaxial $CoSi_2$ phase. Unfortunately, the process described has several drawbacks which have prevented commercial acceptance. First, dicobalt octacarbonyl has some serious limitations as a cobalt source precursor. Thermodynamically favorable polymerization and hydrogenation reactions in a CVD chamber compete with the formation of pure cobalt. These reactions include polymerization reactions in the gas phase and reactions with hydrogen yielding highly volatile and extremely unstable hydrocobalt tetracarbonyl compounds. The compound is also known to be unstable during storage, even under vacuum or inert atmosphere. Second, the process also requires a high temperature annealing step (over 800° C.) to form the desired $CoSi_2$ epitaxial phase. Finally, an additional etching process step is required to remove a C-rich layer formed over the epitaxial $CoSi_2$ layer.

CVD methods such as atomic layer deposition (ALD) or atomic layer chemical vapor deposition (ALCVD), hereinafter referred to collectively as ALCVD, are attractive methods for the production of device features with sub-tenth micron geometries because of the ability to produce ultrathin, highly conformal layers with atomic-level controllability. In an ALCVD process, a film is grown by repeatedly forming ultrathin layers, with the ultimate thickness of the film being determined by the number of layers deposited. The source precursor is adsorbed on the substrate surface in a self-limiting manner, such that a single monolayer is formed. The precursor is subsequently decomposed to form a single molecular layer of the desired material.

Unfortunately, no ALCVD process for the growth of cobalt or electronic grade cobalt disilicide have been reported. In general, source precursors that have been used for the deposition of cobalt are not amenable to self-limiting adsorption of a monolayer on the substrate required by an ALCVD process. The cobalt source precursors have not shown sufficient stability under ALCVD processing conditions, decomposing prematurely upon contact with the substrate surface, causing the growth of highly contaminated cobalt films. Therefore, there is a need for an ALCVD process for producing ultrathin, conformal pure cobalt and cobalt disilicide films, using cobalt source precursors that are stable under processing conditions and readily adsorb on the substrate to form a monolayer.

SUMMARY OF THE INVENTION

It has been unexpectedly found that chemical vapor deposition of pure cobalt films, capping the film with titanium nitride, and annealing the composite structure yields epitaxial cobalt disilicide films. Accordingly, in one aspect, the present invention relates to a process for forming an epitaxial cobalt disilicide layer on a silicon substrate. The process comprises:

(a) vaporizing a cobalt source precursor;

(b) decomposing said cobalt source precursor on the silicon substrate to form on the silicon substrate an ultrathin interfacial layer and a cobalt layer over the ultrathin interfacial layer;

(c) forming, over the cobalt layer, a capping layer comprising at least one of a refractory metal, a refractory metal nitride, a refractory metal carbide, a binary nitride of a refractory metal, a binary carbide of a refractory metal, a ternary nitride of a refractory metal and a ternary carbide of a refractory metal; and (d) annealing at a temperature sufficiently high and for a period sufficiently long to form the epitaxial cobalt disilicide layer on the silicon substrate.

The cobalt source precursor is selected from cobalt tricarbonyl nitrosyl; cobalt tetracarbonyl iodide, cobalt tetracarbonyl trichlorosilane, carbonyl chloride tris(trimethylphosphine) cobalt, cobalt tricarbonylhydrotributylphosphine, acetylene dicobalt hexacarbonyl and acetylene dicobalt pentacarbonyl triethylphosphine, and is preferably cobalt tricarbonyl nitrosyl. The refractory metal is chosen from titanium, tantalum, and tungsten, and is preferably titanium. The refractory metal nitride is preferably titanium nitride, and the capping layer preferably comprises titanium and titanium nitride, and more preferably layer of titanium nitride over a layer of titanium. The capping layer may be formed by physical vapor deposition.

The silicon substrate may be heated to a temperature ranging from 300° C. to 600° C. in order to decompose the cobalt source precursor on the silicon substrate, and preferably is heated to a temperature of about 390° C. Annealing may be performed at a temperature ranging from about 700° C. to 1000° C., for a period ranging from about 30 seconds to about 90 seconds, and preferably is performed at about 725° C., for about 30 seconds. The cobalt layer preferably has a thickness of about 30 nm.

In another aspect, an ALCVD process for producing ultrathin, conformal pure cobalt and cobalt disilicide films, and that uses cobalt source precursors that are stable under processing conditions and readily adsorb on the substrate to form a monolayer has been discovered. Accordingly, the present invention also relates to an ALCVD process for the deposition of a layer comprising cobalt on a surface of a substrate in a deposition chamber. The process comprises:

(a) vaporizing a cobalt source precursor;

(b) pulsing the cobalt source precursor into the deposition chamber;

(c) contacting a surface of the substrate with the cobalt source precursor or a composition derived therefrom;

(d) pulsing an inert gas into the deposition chamber; and (e) decomposing the cobalt source precursor or composition derived therefrom to form a layer comprising cobalt on the surface of the substrate.

The process may additionally comprise the step of pulsing a reactant gas into the deposition chamber, and/or pulsing an inert gas into the deposition chamber, after pulsing an inert gas into the deposition chamber and before decomposing the cobalt source precursor. The substrate may heated to a temperature ranging from about 300° C. to about 600° C., and preferably to a temperature of 390° C. The steps may be performed repeatedly in sequence to form a plurality of cobalt layers on the substrate.

The cobalt source precursor may be selected from cobalt tricarbonyl nitrosyl, cobalt tetracarbonyl iodide, cobalt tetracarbonyl trichlorosilane, carbonyl chloride tris(trimethylphosphine) cobalt, cobalt tricarbonylhydrotributylphosphine, acetylene dicobalt hexacarbonyl and acetylene dicobalt pentacarbonyl triethylphosphine, and is preferably cobalt tricarbonyl nitrosyl. The reactant gas may be hydrogen, and a carrier gas may be pulsed into the deposition chamber with the cobalt source precursor.

In yet another aspect, the invention relates to an ALCVD process for forming an epitaxial cobalt disilicide layer on a silicon substrate which comprises:

(a) vaporizing a cobalt source precursor;

(b) pulsing the cobalt source precursor into the deposition chamber;

(c) contacting a surface of the substrate with the cobalt source precursor or a composition derived therefrom;

(d) pulsing an inert gas into the deposition chamber;

(e) decomposing the cobalt source precursor or composition derived therefrom to form a layer comprising cobalt on the surface of the substrate;

(f) forming a capping layer comprising at least one of a refractory metal, a refractory metal nitride, a refractory metal carbide, a binary nitride of a refractory metal, a binary carbide of a refractory metal, a ternary nitride of a refractory metal and a ternary carbide of a refractory metal; and (g) annealing at a temperature sufficiently high and for a period sufficiently long to form an epitaxial cobalt disilicide layer.

Annealing may be performed at a temperature ranging from about 700° C. to 900° C., and preferably at about 725° C. The annealing period may range from about 30 seconds to about 180 seconds, and is preferably about 30 seconds. The cobalt layer may have a thickness of about 30 nm.

DETAILED DESCRIPTION OF THE INVENTION

Figure 1:
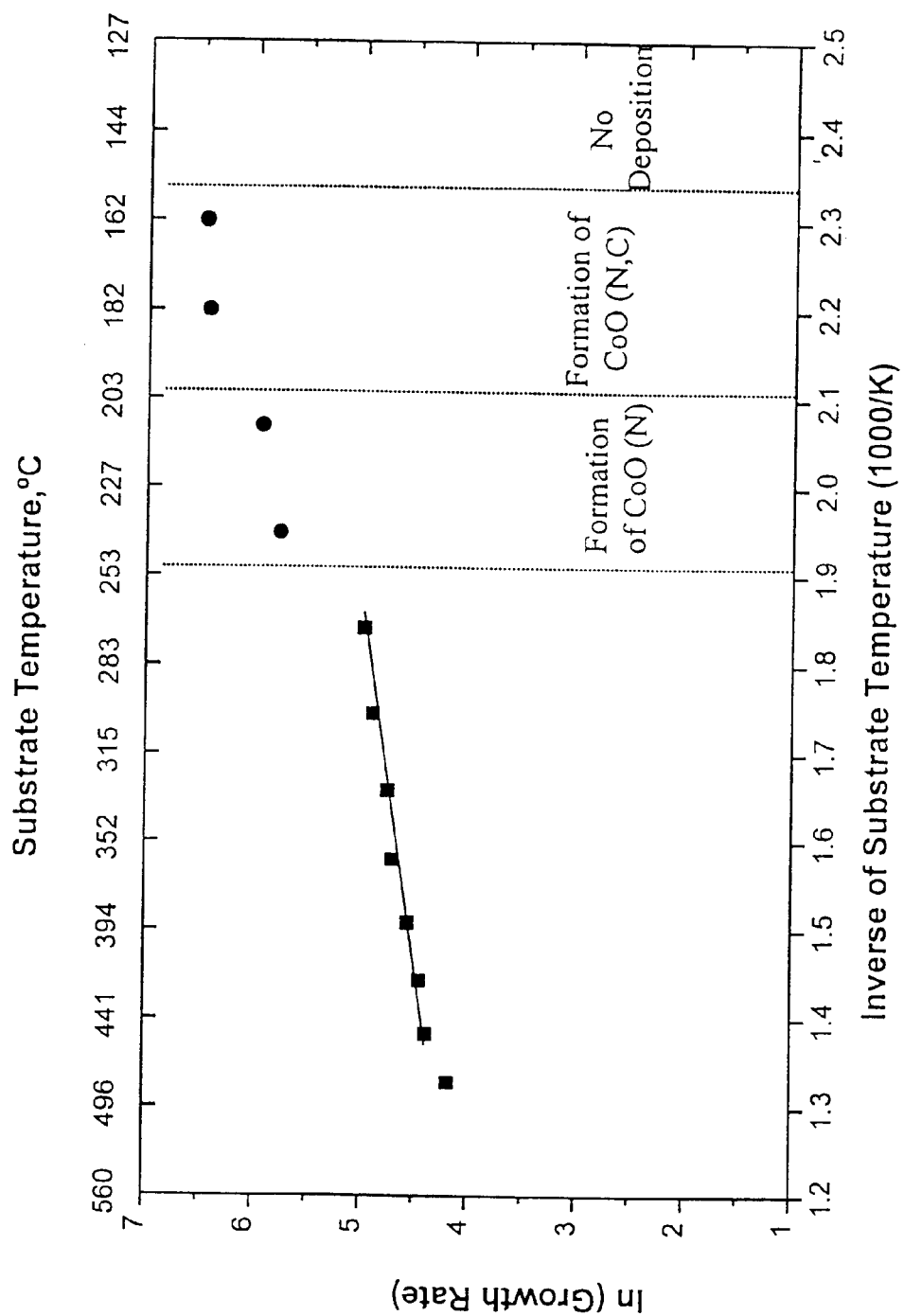
FIG. 1 is a typical Arrhenius plot of ln(growth rate) for CVD Co as a function of inverse of substrate temperature in degrees Kelvin. The study investigated the bulk properties of the CVD Co film only and did not examine the Co/Si interface.

The present invention provides a CVD-based process for the preparation of conformal epitaxial cobalt disilicide layers or films. Initially, a conformal cobalt layer or film is deposited on a silicon substrate a silicon substrate such as that used in semiconductor devices from a vaporized cobalt source precursor. During this CVD step, an ultrathin interfacial layer is formed over the silicon substrate and under a pure cobalt layer. A layer of a refractory metal and/or a refractory metal nitride is then formed over the cobalt film. Finally, the layers are annealed to form a layer of epitaxial cobalt disilicide under the capping layer.

The CVD method of the present invention employs interlayer mediated epitaxy (IME) to reduce the rate of diffusion of cobalt to the Co/Si interface. According to the CVD method of the present invention, IME is achieved through the formation of an ultrathin $Co_xSi_yO_zN_q$ based layer, where x, y, z and q are 0 or integers from 1 to 4, at the Co—Si interface during the initial steps of the CVD growth process. This ultrathin interfacial layer acts to slow down of the overall silicidation reaction and to allow formation of the $CoSi_2$ phase and occurrence of epitaxial grain alignment at the same time.

A cobalt film may be deposited from a cobalt source precursor which is vaporized in a CVD reactor. Suitable cobalt source precursors are cobalt carbonyl compounds containing cobalt in a zero oxidation state. With this type of precursor, metal-ligand bonds are broken cleanly at low temperatures when the metal is in a zero oxidation state, yielding pure cobalt films. Suitable cobalt carbonyl compounds are volatile under CVD conditions and may typically be transported without degradation or decomposition. Both mononuclear compounds, such as cobalt tricarbonyl nitrosyl, cobalt tetracarbonyl iodide, cobalt tetracarbonyl trichlorosilane, carbonyl chloride tris(trimethylphosphine) cobalt, and cobalt tricarbonyl-hydrotributylphosphine, and dinuclear compounds, such as acetylene dicobalt hexacarbonyl and acetylene dicobalt pentacarbonyl triethylphosphine, may be used. Mononuclear, heteroleptic cobalt carbonyl compounds are preferred, particularly cobalt carbonyl nitrosyl. From a manufacturing standpoint, $Co(CO)_3NO$ has physical properties that are particularly advantageous in a CVD process. It has high vapor pressure (26 torr at 0° C., 100 torr at 25° C.), it is available in liquid form, and it has good thermal stability during transport and handling.

According to the CVD method of the present invention, the cobalt tricarbonyl nitrosyl, $Co(CO)_3NO$, type precursors are characterized by adsorption and decomposition pathways that allow the inherent formation of an ultrathin $Co_xSi_yO_zN_q$ based layer, where x, y, z and q are integers that could range from 0 to 4, at the Co—Si interface during the initial steps of the CVD growth process. While not wishing to be bound by theory, the decomposition reactions that occur during the early stages of precursor interaction with the substrate surface, and which result in the formation of the ultrathin $Co_xSi_yO_zN_q$ based layer, could proceed along one of the following pathways, as illustrated for the case of the $Co(CO)_3NO$ source precursor on a silicon surface:

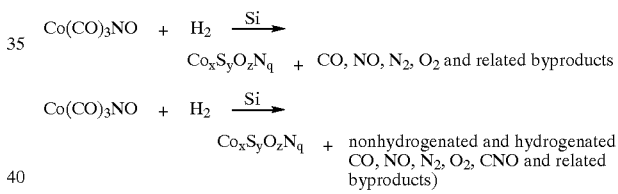

The specific composition and exact thickness of the ultrathin $Co_xSi_yO_zN_q$ interfacial layer can be tightly tailored by varying the temperature of the substrate and the ratio of the source precursor to reactant (e.g., hydrogen) gaseous flows, with lower substrate temperature resulting in the formation of an interfacial layer with higher O and N incorporation.

Pure cobalt films are typically deposited in a CVD reactor at temperatures ranging from heated to a temperature ranging from about 300° C. to about 600° C. Preferably deposition temperatures range from about 300° C. to 500° C., and a most preferable deposition temperature is about 390° C. The deposition is typically performed under reduced pressure, preferably in the range from 0.5 torr to 15 torr, and most preferably at a pressure of 1.5 torr, although atmospheric pressure or pressure above atmospheric pressure may also be used. An inert carrier gas may be used to facilitate transport of the vaporized cobalt source precursor to the substrate. Inert gases typically used include nitrogen, helium, argon, xenon, and hydrogen.

Pure cobalt films are typically deposited in a CVD reactor at temperatures ranging from heated to a temperature ranging from about 300° C. to about 600° C. In particular, deposition temperatures may range from about 300° C. to 500° C., and, specifically, the deposition may be about 390°

C. The deposition is typically performed under reduced pressure, particularly at about 1.5 torr, although atmospheric pressure or pressure above atmospheric pressure may also be used. An inert or reactive carrier gas may be used to facilitate transport of the vaporized cobalt source precursor to the substrate. Inert gases typically used include nitrogen, helium, xenon, and argon. It is desirable that the deposition should occur in a reducing environment. One method for providing reducing conditions during the deposition is to use a reactive carrier gas, or reactant gas, that is a reducing agent; hydrogen is typically used for this purpose. However, hydrogen may not be necessary in some cases, in particular, as the environment at a surface of the silicon substrate is typically a reducing environment. Hydrogen may be used as reactant gas in the CVD deposition of pure cobalt from cobalt source precursors. Hydrogen acts to passivate the reaction byproducts, including CO, NO, and CNO, ensuring their elimination from the reaction zone, and preventing their incorporation in the growing cobalt film. While not wishing to be bound by theory, the decomposition reaction cobalt tricarbonyl nitrosyl in the presence of hydrogen may proceed along the following potential pathway, as illustrated for the case of the $Co(CO)_3NO$ source precursor on a silicon surface:

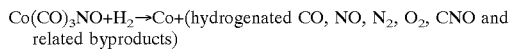
$Co(CO)_3NO+H_2 \rightarrow Co+$(hydrogenated CO, NO, $N_2$, $O_2$, CNO and related byproducts)

Preferably the hydrogen flow rate ranges from about 100 to 1000 sccm, and a most preferably from about 500 sccm to 1000 sccm.

In another embodiment of the invention, cobalt may be deposited by an atomic layer deposition (ALD) or atomic layer chemical vapor deposition (ALCVD) process. ALD and ALCVD are hereinafter referred to collectively as ALCVD. In an ALCVD process for deposition of cobalt, a cobalt film can be grown in the form of a plurality of ultrathin layers of atomic level controllability, with the thickness of the ultimate cobalt film being determined by the overall number of ultrathin layers deposited. ALCVD techniques are based on the principle of self-limiting adsorption of individual monolayers of the source precursor on the substrate surface, followed by decomposition of this precursor to form a single molecular layer of the desired material. Decomposition may occur through reaction with an appropriately selected reagent. Thicker films are produced through repeated growth cycles until the target thickness is achieved. In an ALCVD process, a substrate with at least one surface to be coated, a source precursor, and any reactant(s), necessary for forming a desired product, and which is capable of reacting with the precursor to form a desired product on the substrate surface, such as a film, liner, layer or other material, are introduced into a deposition chamber. The precursor and reactant(s), both of which are typically in vapor or gaseous form, are pulsed sequentially into the deposition chamber with inert gas pulses in between the precursor and reactant pulses, for a specified, typically predetermined, short period of time, and allowed to react on the substrate surface to form an atomic layer of the desired thickness, typically on the scale of an atomic monolayer.

An ALCVD process for a deposition of cobalt according to the present invention relates to introducing into a deposition chamber a substrate having a surface, and heating the substrate to a temperature that allows adsorption of the cobalt source precursor, or an appropriate intermediate of the cobalt source precursor. The heated substrate surface is then exposed to a cobalt source precursor for a period of time sufficient to form a self-limiting monolayer of the source precursor or a compound or compounds (composition) derived from the source precursor on the substrate surface. The precursor is introduced into the deposition chamber by pulsing, using an appropriate precursor delivery method with or without the use of a carrier or transport gas. The carrier gas is typically an inert gas and may be nitrogen, helium, argon, xenon, or nitrogen. Argon is particularly useful. The deposition chamber is then purged with an inert gas, such as argon, for a period sufficiently long to ensure removal of all gas precursor species, without removing the adsorbed precursor layer. The inert gas is introduced by pulsing using an appropriate mass flow controller or valving system. Any such system, including those mentioned above and known to those skilled in the art or to be developed may be used for such purpose. If desired, a reactant gas such as hydrogen is then introduced into the deposition chamber for a period sufficiently long to ensure reaction with the adsorbed precursor layer, resulting in the formation of a first cobalt atomic layer on the substrate surface. The reactant gas is also introduced by pulsing using an appropriate mass flow controller or valving system. Finally, if desired, the deposition chamber is again purged with an inert gas for a period long enough to ensure removal of all remaining non-inert gases from the deposition chamber. This process of intermittent pulsing of precursor and reactant(s), followed by purging with inert gas, continues until a film of desired thickness is formed. Multilayer films where very thin layers, i.e., on the order of monolayers, having different compositions, may be formed by using source precursors of one or more different metals and/or different reactant gases in appropriate steps. Alloy layers may be formed by mixing more than one precursor and/or more than one reactant gas in a single step. Films initially formed as multilayer films may result in alloy films where individual layers blend with adjacent layer under deposition conditions. Multilayer films may be converted to alloy films by annealing. Typically a total film thickness of from about 2.5 nm to about 1000 nm is achieved, with the total thickness is determined by the ultimate application of the film.

Pulsing of the precursor is carried out using conventional pressure-based and/or temperature-based mass flow control-type delivery systems, or solid-source-type delivery systems, which may be coupled to the deposition chamber, if needed, through pneumatically or electronically controlled valves that allow introduction of the cobalt source precursor in short pulses into the deposition chamber. The pulsing of the reactant gas is carried out using electronic mass flow controllers which can also be coupled to the deposition chamber, if needed, through pneumatically or electronically controlled valves that allow introduction of the reactant gas in short pulses into the deposition chamber.

The length of each precursor and reactant gas pulse depends on several factors, including the reactor pressure, substrate temperature, desired thickness, reaction rate, and reactivity of the components used. For example, at higher reaction rates and/or higher component reactivities with respect to each other, shorter pulses are required. The pulse length for the precursor and reactant gas typically ranges from about 0.5 seconds to about 10 minutes, and particularly from about 1 second to about 5 minutes. The pulse length for the precursor and reactant gas are varied to achieve layers of thickness from about 0.25 nm to about 10 nm and, particularly from about 0.5 nm to about 2.5 nm. It will be understood, based on this disclosure, that the time and thickness may be varied for different applications and optimized within the parameters of a given reaction and deposition, provided that the thin layer benefits of the invention are not significantly diminished.

The deposition chamber is purged after each precursor pulse, and after each reactant gas pulse, if any. Purging is accomplished by pulsing an inert, cleaning or purge gas into the deposition chamber in order to remove the precursor gas, reactant gas(es) or reaction byproducts from the chamber. The purge gas may be argon, xenon, nitrogen, or krypton, particularly argon or nitrogen. Purging may continue for a period of time sufficient to terminate the reaction. Typically, purging occurs for from about 0.5 seconds to about 10 minutes, and particularly, for from about 1 second to about 5 minutes.

The process may be stopped with the formation of a monolayer of cobalt, or the process steps may be repeated in sequence for form a plurality of atomic layers of cobalt, until a film of desired thickness is built up on the substrate.

During the cobalt deposition, the substrate temperature is maintained at a temperature high enough to allow precursor species adsorption, but not so high as to cause premature precursor decomposition. Typically, the substrate is maintained in the chamber at an interior reaction substrate temperature of less than about 450° C., particularly from about 50° C. to about 300° C., and specifically from about 100° C. to about 275° C. Other processing conditions for the ALCVD processes of the present invention, including flow rates and pressure ranges, are similar to those noted above for thermal CVD.

Without wishing to be bound by theory, it is believed that growth of cobalt layers in the ALCVD processes of the present invention begins with the adsorption on the substrate surface of precursor intermediate species that are conducive to the monolayer-by-monolayer reaction with reactant gases. In particular, the deposition of cobalt from cobalt tricarbonyl nitrosyl is believed to occur according to the following pathways:

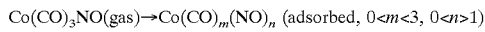

$Co(CO)_3NO(gas) \rightarrow Co(CO)_m(NO)_n$ (adsorbed, $0<m<3$, $0<n>1$)

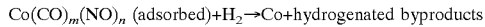

$Co(CO)_m(NO)_n$ (adsorbed)+$H_2 \rightarrow$ Co+hydrogenated byproducts

When the cobalt source precursor is decomposed on the silicon substrate, an ultrathin interfacial layer on the silicon substrate is typically formed in situ, the interfacial layer having a composition $Co_xSi_yO_zN_q$, where x, y, z and q are 0 or integers from 1 to 4, with a pure cobalt layer over the interfacial layer.

Cobalt films, deposited by the CVD or ALCVD method described above, typically having a thickness of about 15–60 nm, and, particularly, about 30 nm, may be converted to cobalt disilicide by the processes of the present invention. The pure cobalt film is covered with an overlayer, or capping layer, of a refractory metal, a nitride or carbide of a refractory metal, or a binary or ternary nitride or carbide of a refractory metal prior to annealing. In particular, the overlayer may be a two-layer structure composed of a TiN layer over a Ti metal layer. In one embodiment, the TiN has a thickness of 12 nm and the Ti metal layer has a thickness 10 nm. The Ti/TiN cap may be deposited in-situ by a PVD technique, such as sputtering. One suitable method is collimated DC sputter deposition using a commercial sputtering cluster tool. Other suitable methods for deposition of the cap layer include thermal and electron beam evaporation, chemical vapor deposition, molecular beam epitaxy, atomic layer epitaxy (ALE), atomic layer deposition (ALD), or atomic layer chemical vapor deposition (ALCVD).

An epitaxial cobalt silicide layer is formed on the silicon substrate by annealing at a sufficiently high temperature and a period sufficiently long to form an epitaxial cobalt disilicide layer on the silicon substrate. Typically, annealing is performed at a temperature ranging from about 700° C. to 1000° C., and particularly at about 725° C. Annealing times may range from about 30 seconds to about 90 seconds, and particularly, about 30 seconds. If desired, after formation of the epitaxial cobalt disilicide layer, the Ti/TiN overlayer may be removed by etching in a solution of ammonia/ hydrogen peroxide in water in the proportions: 3 $NH_4OH$: 1 $H_2O_2$: 2 $H_2O$; unreacted cobalt may be removed with a 10% nitric acid etch.

The invention, as well as the appearance and composition of the pure cobalt and cobalt suicide films deposited according to the method of the invention, and their structural, compositional, and electrical properties, will now be described in accordance with the following, non-limiting examples:

EXAMPLES

Example 1

Kinetic Studies of the Formation Mechanisms of CVD Co

A kinetic study was performed of the decomposition pathways of the $Co(CO)_3NO$ source precursor on Si-based surfaces to establish a thorough understanding of the formation mechanisms of pure Co films. For this purpose, the study only focused on investigating the bulk properties of the CVD Co film, and did not examine the Co/Si interface to document the existence of an ultrathin $Co_xSi_yO_zN_q$ based layer at the Co-substrate interface. The latter was carried out instead in Example 2 below.

In this example, the cobalt films were formed by thermal CVD on Si(100), non-pattern silicon dioxide ($SiO_2$) and silicon nitride ($Si_3N_4$) on silicon substrates. The $SiO_2$ and $Si_3N_4$ layers had a thickness of, respectively, 250 and 80 nm. The substrates were subjected to a pre-deposition, ex-situ organic chemical clean consisting of an acetone and methanol rinse. The native oxide was subsequently etched in a 10% hydrofluoric acid solution followed by a deionized water rinse. The samples were dried in a high-purity argon atmosphere.

FIG. 1 displays an Arrhenius plot of the In (growth rate) versus the reciprocal absolute temperature for thermal CVD Co from $Co(CO)_3NO$. As can be seen in FIG. 1, no film deposition was observed below 1 50° C. Between 150 and 200° C., the bulk film was composed of a cobalt oxide phase heavily contaminated with carbon and nitrogen. This is also shown in the XPS and XRD data shown in FIG. 2 and FIG. 3, respectively, and the data listed in Table 1. The films were typically electrically insulating.

TABLE 1

[0047]
Summary of Bulk Film Characteristics
as Function of Substrate Temperature

| Temperature Range | 150 to 200° C. | 210 to 250° C. | 250 to 350° C. | 350 to 480° C. |
|---|---|---|---|---|
| Oxygen, at % (XPS) | 15 to 25 | 15 to 20 | 2.5 to 10 | <1 at. % |
| Nitrogen, at % (XPS) | 5 to 7 | 4 to 5 | <1 | <1 at. % |
| Carbon, at % (XPS) | 4 | <1 | <1 | <1 at. % |
| Resistivity, $\mu\Omega$cm (four point probe) | >1000 | >1000 | 15 to 40 | 8.5 to 11 $\mu\Omega$cm |
| Structure (XRD) | CoO | CoO | hcp Co | fcc Co |
| RMS Surface Roughness, nm (AFM) | ~10 | 6 to 7 | 20 to 30 | 12 to 18 (up to 450° C.) 110 (above 450° C.) |
| Average Surface Grain Size, nm (AFM) | ~70 | 63 | 135 | 75 to 112 (up to 450° C.) 500 to 3000 (above 450° C.) |

Figure 2:
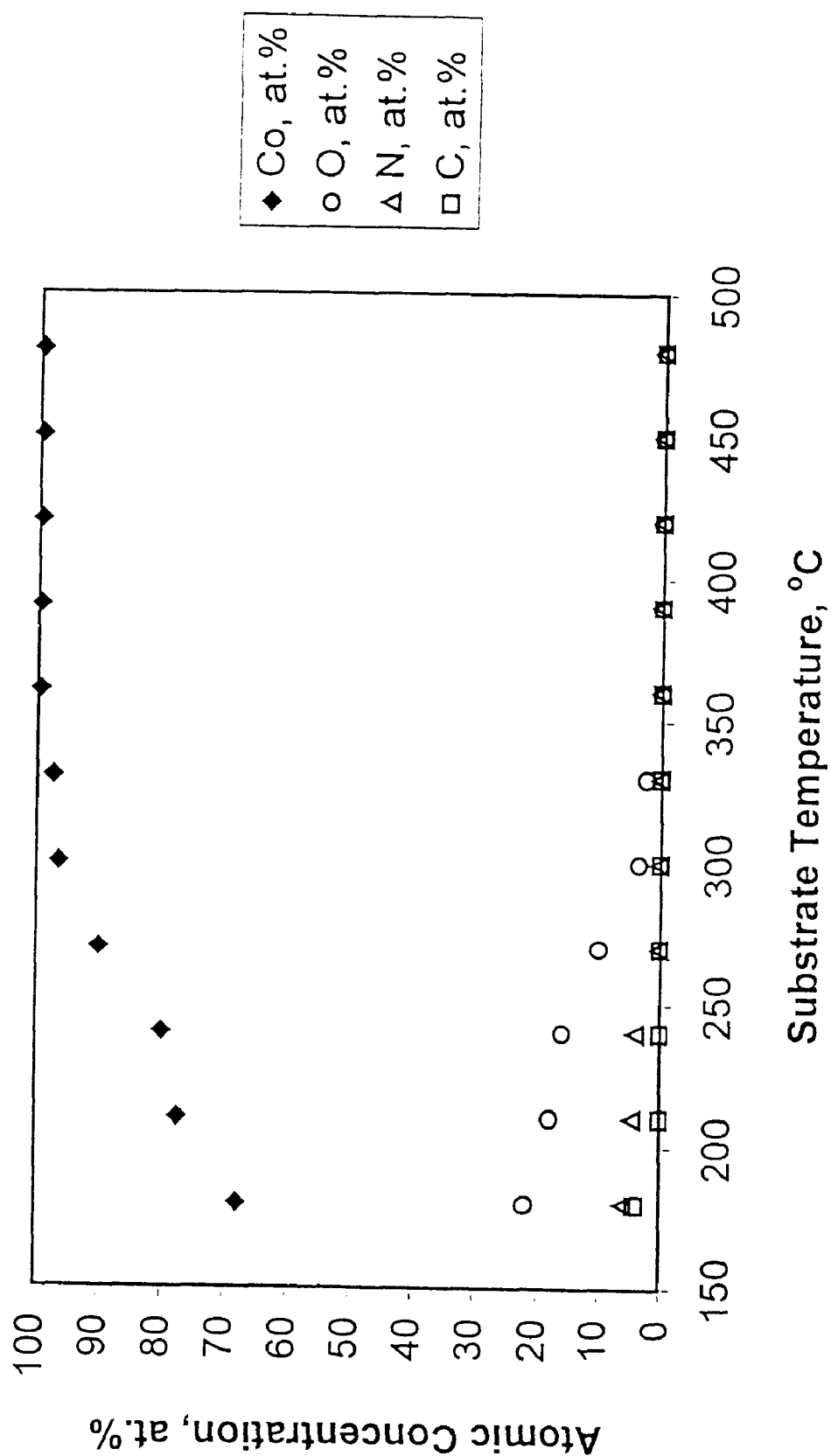
FIG. 2 is a typical representation of high resolution x-ray photoelectron spectroscopy (XPS) spectra of the $Co2p_{3/2}$ elemental core peaks for thermal CVD Co films formed in accordance with an embodiment of the process of the invention in Example 1.
Figure 3:
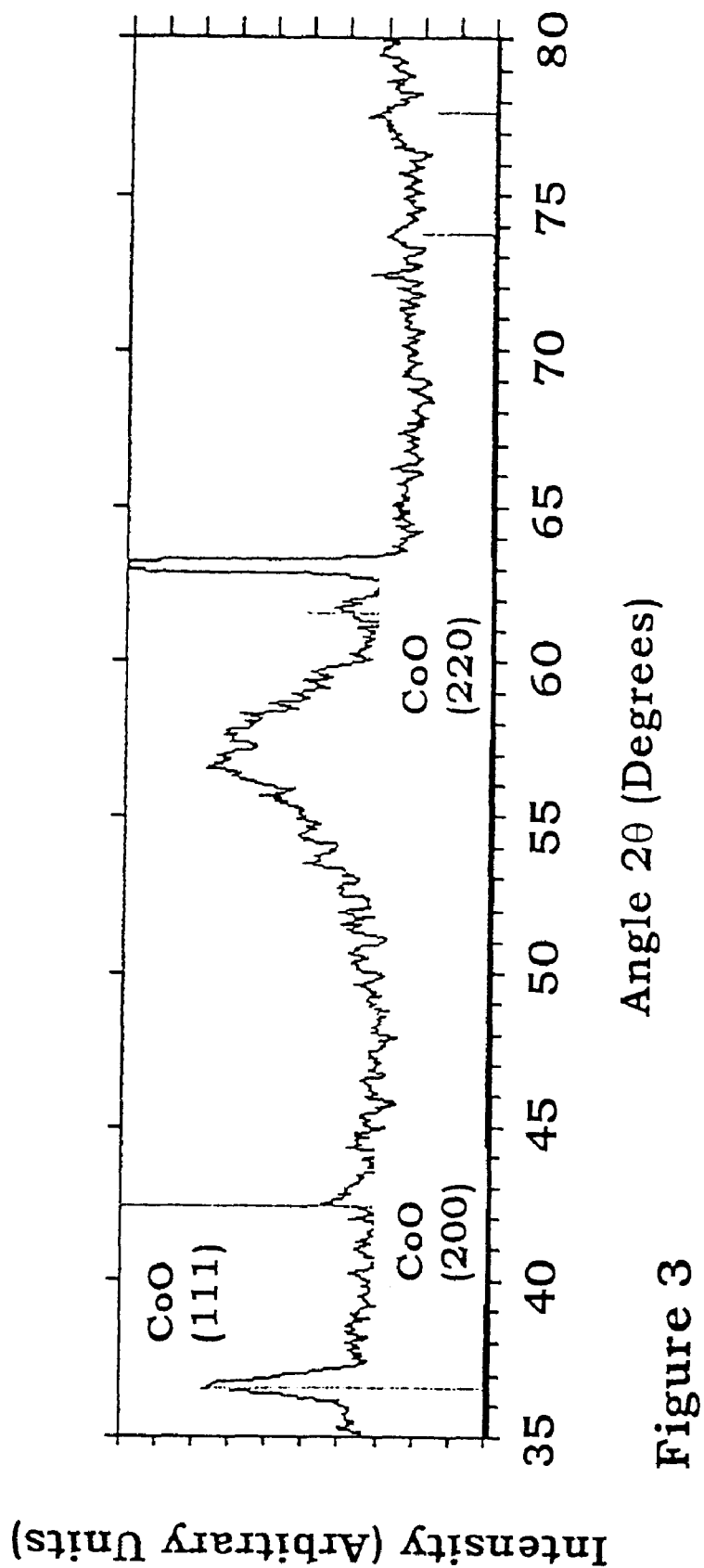
FIG. 3 is a representation of the x-ray diffraction (XRD) pattern of thermal CVD Co films grown in Example 1 at substrate temperature of 180° C.

Between 200 and 250° C., no carbon was detected in the CoO phase, even though the films were still contaminated with N, as documented by the XPS data shown in FIG. 2. This finding is supported by the energetics of chemical bonding configurations in $Co(CO)_3NO$. In particular, it is known that the Co—NO bond in $Co(CO)_3NO$ is a three electron $\pi$-type bond, which is shorter than the Co—CO bond. These characteristics indicate that the Co—NO bond is thus stronger, and is thus expected to require even higher energy to cleave, than the Co—CO bond. It is thus suggested that in the temperature regime of 200 to 250° C., the thermal budget available is conducive to complete dissociation of the Co—CO, but not the Co—NO bond. This results in the presence of Co—NO radicals on the Si surface. These radicals may subsequently react to produce a nitrogen-contaminated CoO phase.

In the process temperature range of 250 to 350° C., the films were composed of a Co phase, with a small concentration of the CoO phase. Finally, in the temperature range above 350° C., the films were Co metal, as shown in FIG. 2. The observed trend in the dependence of growth rate on substrate temperature indicates that the CVD Co process is in the mass-transport limited regime. The results indicate that the deposition of pure cobalt occurs upon the availability of sufficient thermal energy for complete precursor dissociation, and complete desorption of reaction by-products from the substrate surface prior to the occurrence of the undesirable reactions discussed above.

Example 2

Formation of Epitaxial $CoSi_2$ from CVD Co with Ti/TiN Overlayer

Cobalt films were formed by thermal CVD on Si(100), non-pattern silicon dioxide ($SiO_2$) and silicon nitride ($Si_3N_4$) on silicon substrates. The $SiO_2$ and $Si_3N_4$ layers had a thickness of, respectively, 250 and 80 nm. The substrates were subjected to a pre-deposition, ex-situ organic chemical clean consisting of an acetone and methanol rinse. The native oxide was subsequently etched in a 10% hydrofluoric acid solution followed by a deionized water rinse. The samples were dried in a high-purity argon atmosphere. Cobalt tricarbonyl nitrosyl ($Co(CO)_3NO$) was used as the source precursor. The deposition was performed in a standard custom-designed, stainless steel alpha-type CVD reactor under the following conditions:

| | |
|---|---|
| Substrate Temperature | 390° C. |
| Precursor Flow Rate | 0.5 sccm |
| Hydrogen Reactant Flow Rate | 750 sccm |
| Process Working Pressure | 1.5 torr |

Cobalt films having a thickness of (30±3 nm) resulted. As-deposited film properties are presented in Table 2.

The cobalt films were then capped with a bilayer of titanium nitride over titanium without any cleaning in order to avoid any chemical changes in the cobalt surface. The Ti/TiN capping layers were deposited in situ, using collimated DC sputter deposition on a commercial Varian $MB^2$-830 sputter cluster tool. Base pressure prior to deposition was in the $10^{-9}$ torr range.

TABLE 2

[0054]
Properties of CVD Cobalt Films

| Property (Measurement Technique) | Value |
|---|---|
| Oxygen, Carbon, Nitrogen (XPS) | All below 1 at. % (detection limits of XPS) |
| Thickness (RBS and SEM) | 30 ± 3 nm |
| Resistivity (four point probe) | 15 ± 1.5 $\mu\Omega$cm |
| Structure (XRD) | fcc Co |
| RMS Surface Roughness (AFM) | ~36 nm |
| Average Surface Grain Size | ~200 nm |

Sputtering was performed at room temperature, 2 mtorr process pressure, 40 sccm Ar sputtering gas, and 100 mm target to substrate.

TiN deposition was carried out with the same Ti target, using 65 sccm $N_2$ reactant gas, 40 sccm Ar sputtering gas, a process of pressure of 4 mtorr, and substrate to target spacing of 116 mm. The thickness of the resulting titanium layer was about 10 nm; the titanium nitride layer was about 12 nm thick.

Samples were annealed in an Ag Associates Heatpulse Model 610 single-wafer rapid thermal process (RTP). Samples were placed on a 5-inch carrier sensor wafer equipped with a K type thermocouple. The thermocouple was used to provide real-time measurements of sample temperature during actual annealing. The oven was purged with ultrahigh purity nitrogen (99.999%) for 10 minutes prior to each annealing step. All anneals were carried out in the same nitrogen ($N_2$) atmosphere. The temperature ramp rate was approximately 40° C. per second. At the end of the anneal step, the heating lamps were turned off, and the samples were cooled at a rate of 70 to 120° C. per minute depending on the annealing temperature. Cooling was carried out in the ultrahigh purity nitrogen atmosphere.

Samples were annealed at temperatures of 500° C., 550° C., 600° C., 650° C., 700° C. and 725° C. At each temperature, annealing was carried out for 30, 60 and 90 seconds.

After the annealing step, the Ti and TiN capping layers were removed by selectively etching in a solution of 3 $NH_4OH$: 1 $H_2O_2$: 2 $H_2O$. Unreacted cobalt metal was removed by a 15-minuted etch in a 10% solution of nitric acid in deionized water.

Electrical, chemical and structural properties of the samples were analyzed using Rutherford backscattering spectrometry (RBS), four point resistivity probe, x-ray diffraction (XRD), nuclear reaction analysis (NRA) for hydrogen profiling, and x-ray photoelectron spectroscopy (XPS), high-resolution transmission electron microscopy (HRTEM), and scanning electron microscopy (SEM).

Figure 4:
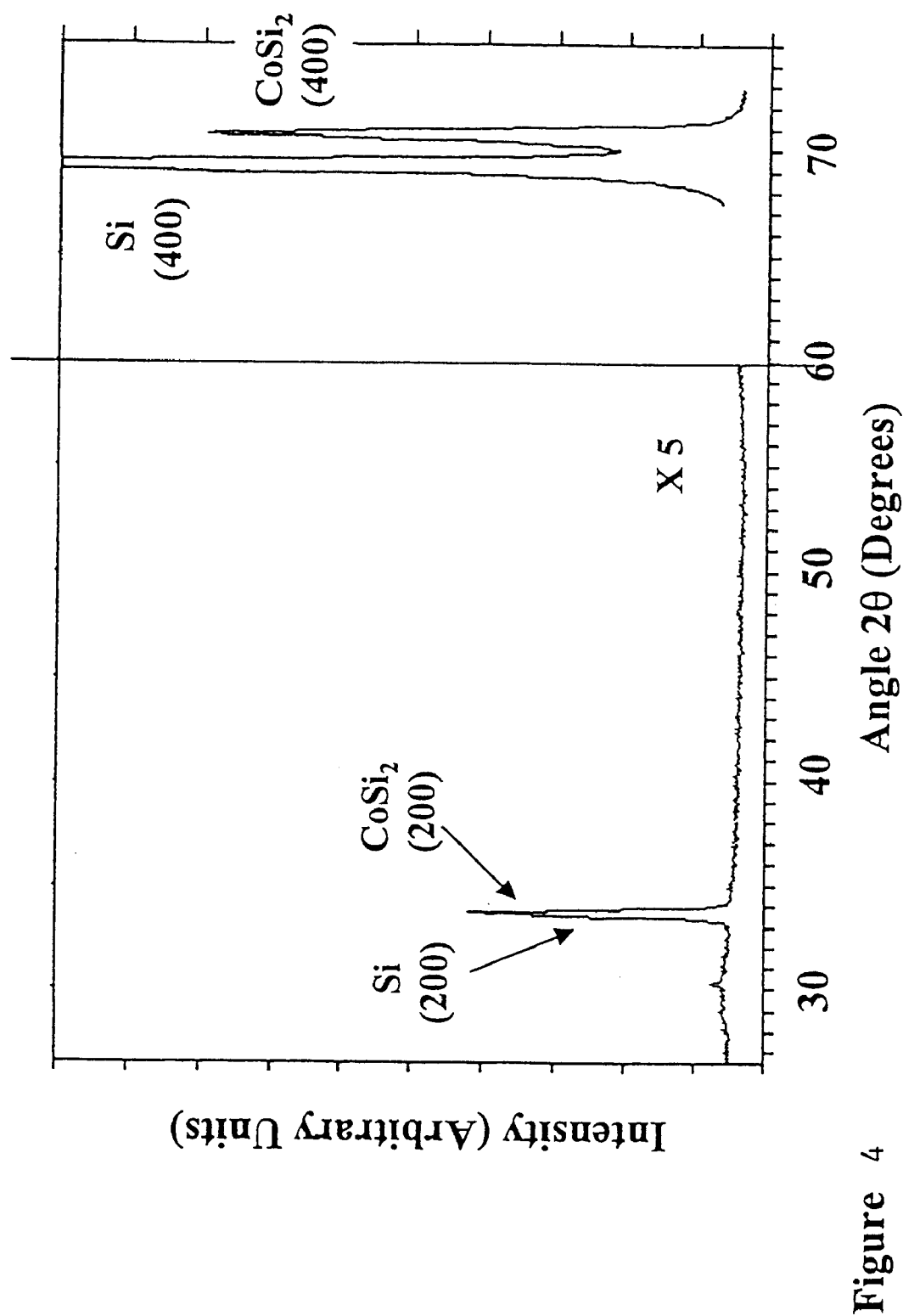
FIG. 4 is a representation of a normal incidence XRD spectrum for a Ti/TiN capped CVD Co film after annealing at 725° C. for 30 s, and selective etch of the Ti/TiN and unreacted Co layers. XRD data indicates the formation of an epitaxial $CoSi_2$ phase.
Figure 5:
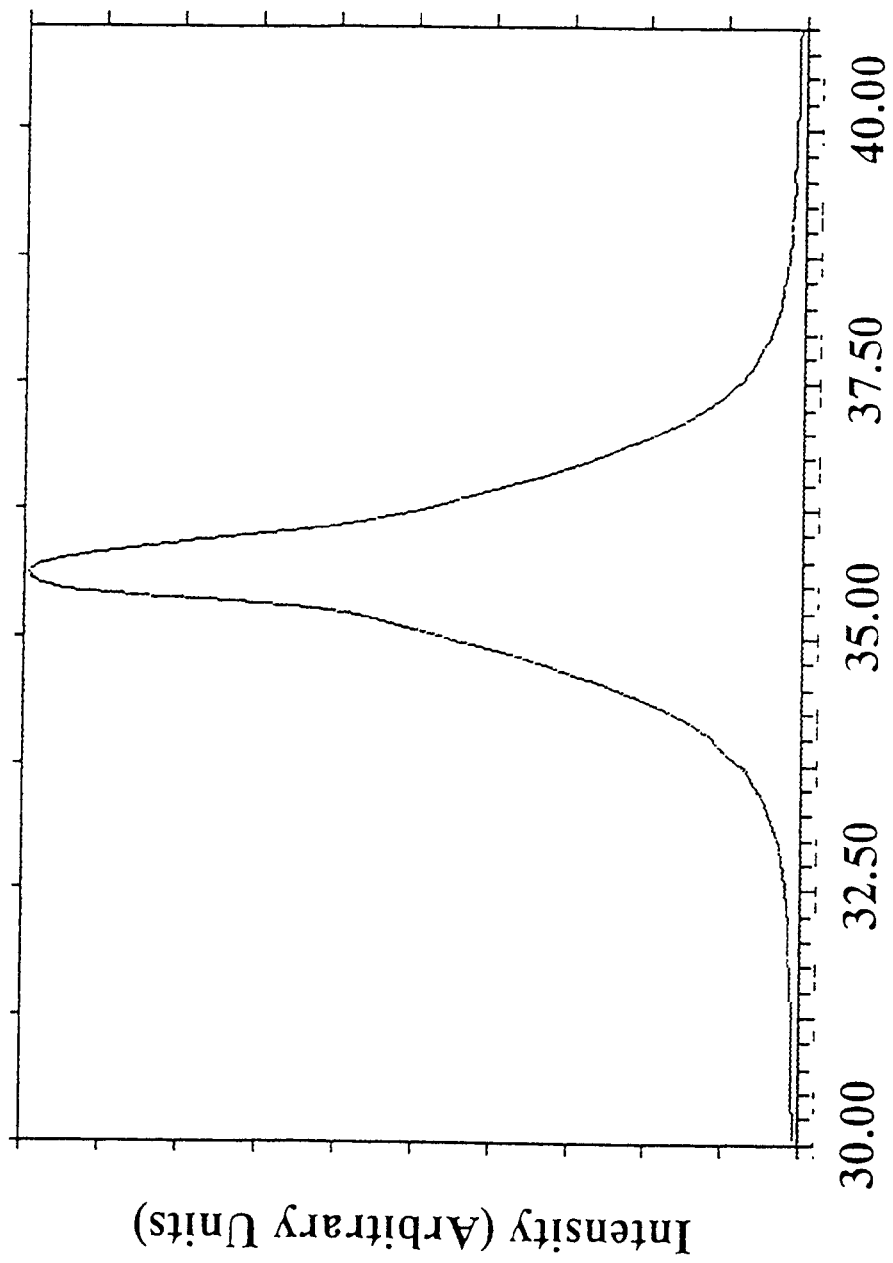
FIG. 5 is a representation of XRD rocking curve (theta scan) measurement for epitaxial $CoSi_2$ (400) reflection. The corresponding full width at half maximum (FWHM) was found to be 1.11°, as compared to a FWHM of 0.7° for the (400) diffraction peak from the single crystal Si substrate.
Figure 6:
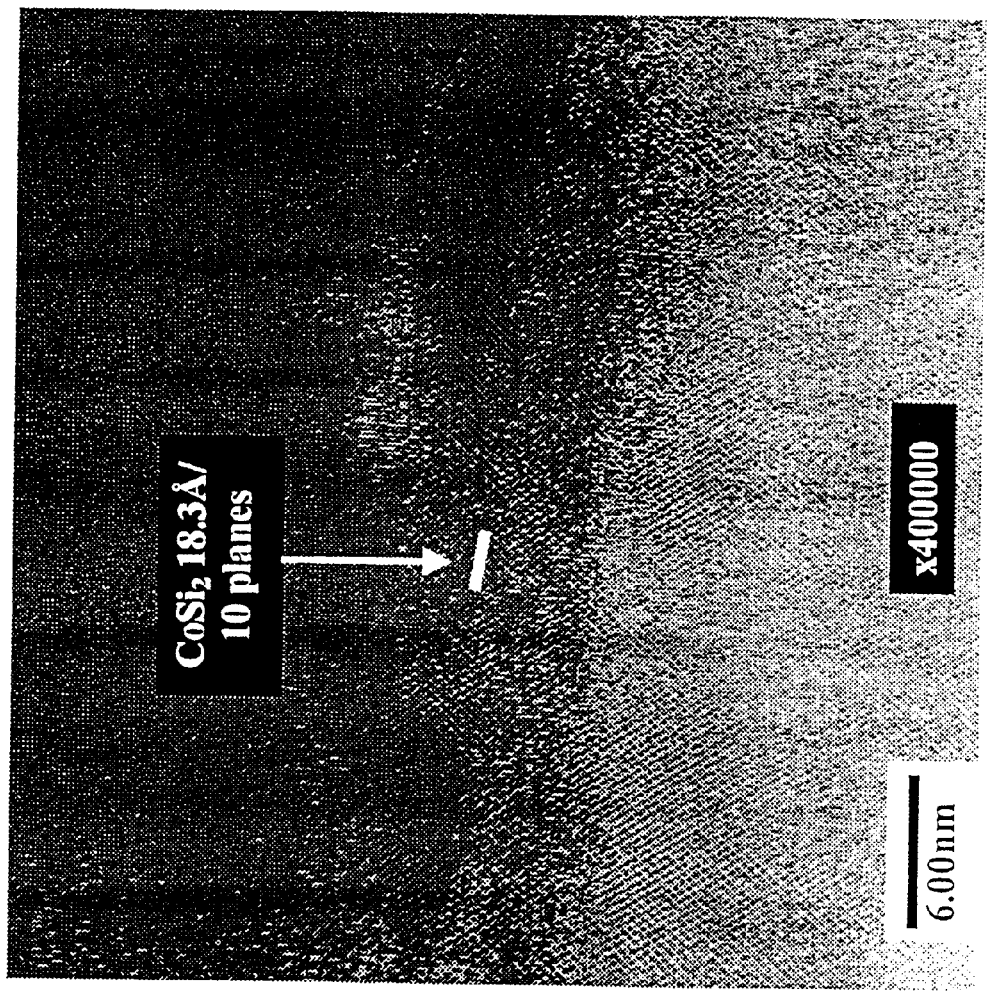
FIG. 6 is a representation of a cross-section, high-resolution TEM-magnified bright field image, collected along the Si<110> zone axis, of an epitaxial $CoSi_2$ film annealed at 725° C. for 30 seconds.

X-ray diffraction analyses were done on a Scintag XDS2000 x-ray diffractometer, equipped with a Cu K$\alpha$ x-ray source and a horizontal wide angle four axis goniometer with stepping motors, which allowed independent or coupled $\theta$-2$\theta$ axes motion. XRD spectra for CVD Co were collected in both normal (Bragg-Bretano) and 5° low angle incidence geometry, and compared to the reference patterns in the Joint Committee for Powder Diffraction Standards (JCPDS) Powder Diffraction File (PDF). XRD spectra for $CoSi_2$ films were collected only in normal geometry. XRD measurements taken after selective etching of the Ti/TiN and unreacted cobalt layers indicated that an epitaxial layer of cobalt disilicide had been formed over the silicon substrate. For example, a typical normal incidence XRD spectrum for the sample annealed at 725° C. for 30 seconds after etching is shown in FIG. 4. Intensity peaks associated with cobalt disilicide (200) and (400) reflections appear on the graph, along with the Si(200) and Si(400) contributions from the underlying substrate, indicating the existence of an epitaxial cobalt disilicide phase. The degree of epitaxy was evaluated by performing an XRD rocking curve (theta scan) measurement for the cobalt silicide (400) reflection (as shown in FIG. 5). The corresponding full width half maximum (FWHM) was found to be 1.110°, compared to a FWHM of 0.7° for the diffraction peak from the single crystal Si substrate. This indicates a high quality epitaxial phase for the cobalt silicide phase. HRTEM bright field confirmed XRD findings regarding the formation of epitaxial cobalt disilicide films. HRTEM was carried-out on a JOEL 2010F field emission electron microscope operating at 200 kV. Imaging was performed with the sample tilted so that the Si<110> zone axis was perpendicular to the incident beam. Cross section TEM specimens were prepared by standard sample preparation procedures, including mechanical sample polishing, dimpling and argon ion milling. TEM analysis was performed on the thinnest region (<50 nm) adjacent to the center hole in the sample. A typical HRTEM micrograph, collected along the Si <100> zone axis, of an epitaxial cobalt disilicide film formed after annealing at 725° C. for 30 seconds is shown in FIG. 6. Complete coherence was observed between the cobalt disilicide layer and the underlying silicon substrate.

Figure 7:
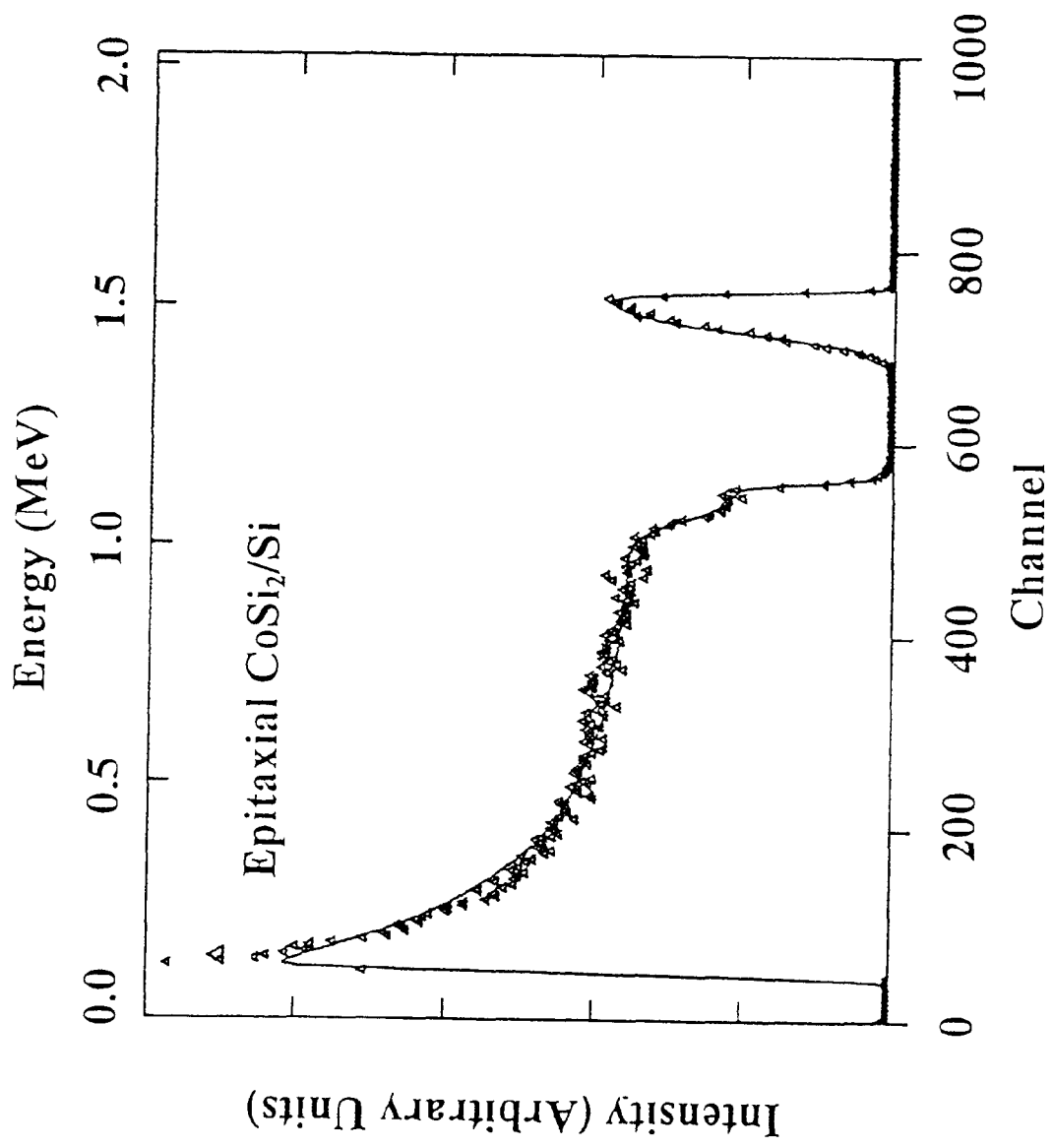
FIG. 7 is a representation of a typical Rutherford Backscattering spectroscopy (RBS) spectrum and associated simulation curve for epitaxial $CoSi_2$ on Si, after selective etch of the Ti/TiN and unreacted Co layers.

RBS was employed to determine film composition and thickness. Data was compiled using a 2 MeV He$^+$ beam on a 4.5 MeV Dynamitron model P.E.E. 3.0 linear accelerator. Film thickness measurements were standardized using SEM on a Zeiss DSM 940 microscope, with a 20 keV primary electron beam. Four point resistivity was calculated using the thickness values measured by RBS and SEM. Nuclear reaction analysis for hydrogen profiling was performed on the same linear accelerator using the $^{15}$N(p, αγ)$^{12}$C nuclear resonance reaction. RBS analyses showed the formation of an epitaxial cobalt disilicide layer 1000 Å thick, as illustrated in FIG. 7. A comparison of the integrated intensity for the RBS cobalt peak for the as-deposited sample with its counterpart after annealing and selective metal etching indicated that about 90% of the CVD cobalt was consumed in the silicide reaction.

Film resistivity was ~23.10 μΩcm. This value is slightly higher than that observed for comparative films deposited by PVD, and is attributed to the presence of residual oxygen in the cobalt disilicide phase, which is believed to have resulted from exposure of the cobalt film to air prior to the Ti/TiN deposition step.

XPS was used to confirm RBS findings in terms of film composition, as well as to determine elemental chemical states. XPS analyses were performed on a Perkin-Elmer PHI 5500 multi-technique system with spherical capacitor analyzer. The gold $f_{7/2}$ line was used as a reference and the analyzer calibrated accordingly. The primary x-ray beam was generated with a monochromatic Al Kα x-ray source at operating power of 300 W and 15 keV applied to the anode. The use of Al Kα primary x-rays allowed the elimination of undesirable interference between the Co LMM and 01s peaks. Depth profiles were acquired after a 30 s or 1 min long sputter clean cycle. The oxygen 1 s peak window (544 to 526 eV) was scanned first after each sputtering cycle in order to avoid any interference between the Co 3 s (101 eV) and Si 2p (99.3 eV) peaks. The photoelectron peak heights were converted to atomic concentration using elemental sensitivity factors. A reference 1000 Å thick CoSi$_2$ sample was analyzed and the sensitivity factor for Si was adjusted to give atomic concentration of 33.33% Co and 66.67% Si in the bulk of the film. Accordingly, the atomic concentration values were recalculated for all samples analyzed.

Figure 8A:
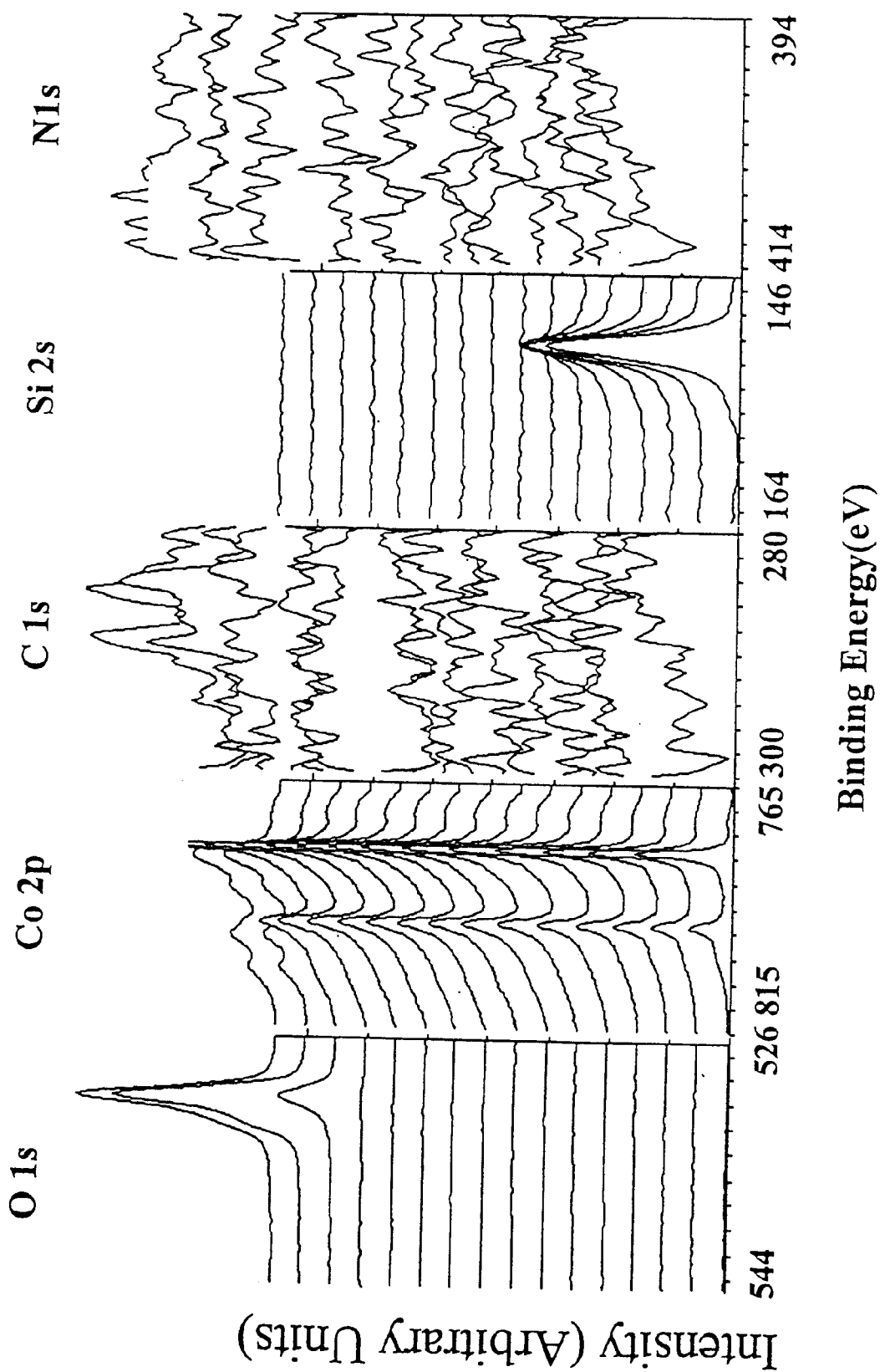
FIG. 8 is a representation of a typical XPS depth profile of selected elemental core peaks for: (a) PVD-deposited, and (b) CVD-deposited Co samples. A comparison of the two spectra indicates the existence of an ultrathin (~5 nm thick) $Co_xSi_yO_zN_q$ based layer, where x, y, z and q are 0 or an integer from 1 to 4, at the Co—Si interface during the initial steps of the CVD growth process.
Figure 8B:
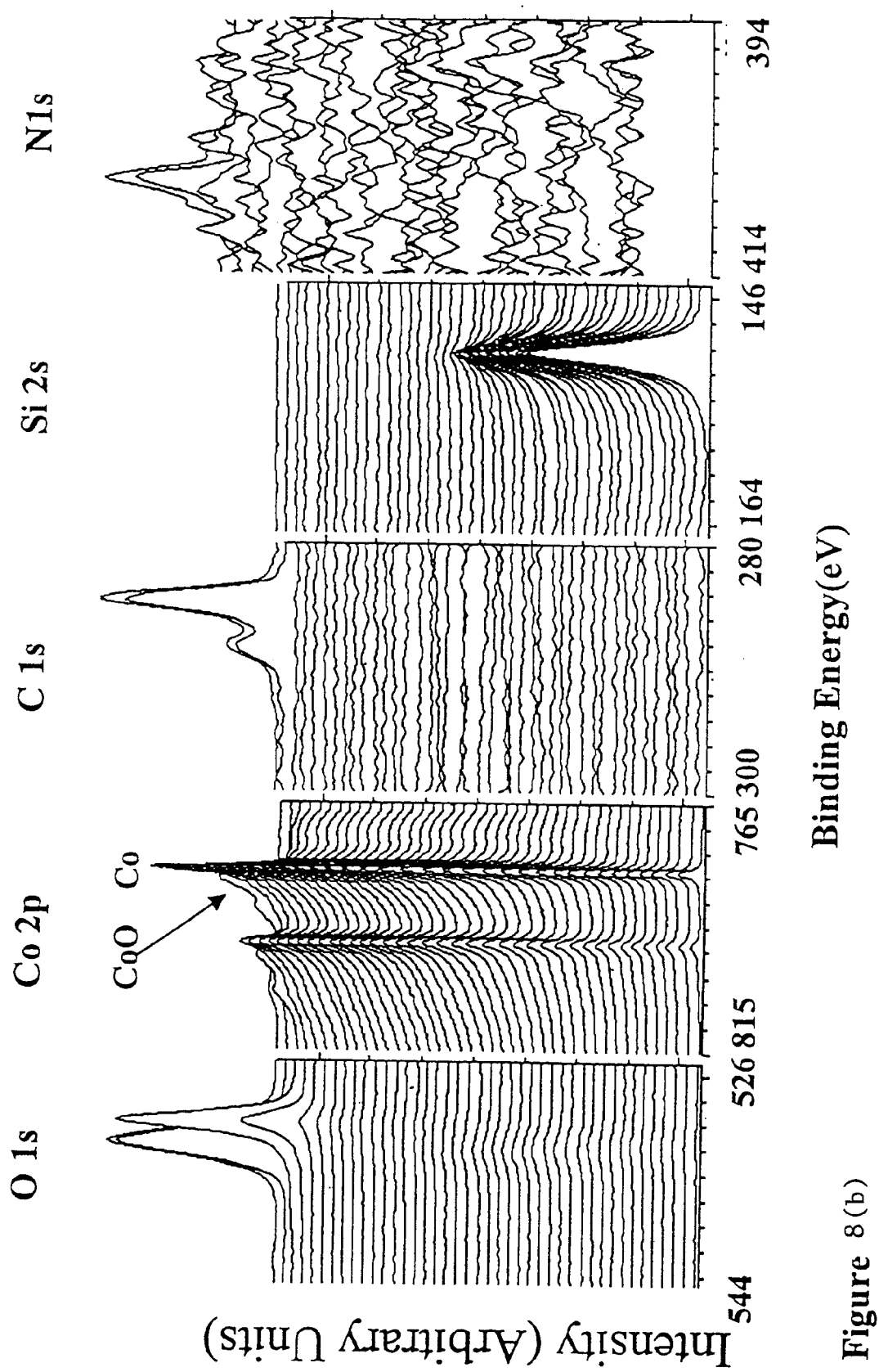

XPS depth profile of the post-annealed samples showed a constant cobalt to silicon ratio throughout the bulk of the silicide. Titanium, carbon and nitrogen were below the detection limits of XPS. The levels of oxygen in the bulk of the cobalt disilicide film and at the silicide/silicon interface were slightly below ~1.5 at % and ~3.0 at %, respectively, indicating the presence of an ultrathin Co$_x$Si$_y$O$_z$N$_q$ based layer at the Co—Si interface during the initial steps of the CVD growth process (within the process window investigated in this case, z and q were, respectively, 2 and 0). Oxygen was observed at the Co—Si interface (FIG. 8($b$)), with the corresponding XPS 01s peak shape and location consistent with a Si—O or Co—Si—O layer. The presence of interfacial oxygen is not attributable to native oxide on the silicon substrate surface, given that all silicon samples were subjected to the same wet chemical treatment prior to CVD and PVD processing, and no oxygen was detected at the Co—Si interface for the PVD Co films (FIG. 8($a$)). The thickness of the interlayer was below the sensitivity limits of RBS and CS-SEM (<10 nm). Based on XPS sputter times and associated ionic yields, the thickness of the layer is estimated at ~5 nm. It is believed that the interfacial layer acts to limit the cobalt supply rate to the silicidation reaction, allowing the formation of the disilicide and the occurrence of epitaxial alignment at the same time.

Examples 3–5 Comparative Examples

Example 3

Failure to Form Epitaxial CoSi$_2$ from Uncapped CVD Co

Cobalt films were deposited by CVD as described in Example 2, and were processed without an overlayer. The samples were annealed as in Example 1, and analyzed by RBS, XRD, NRA, XPS, HRTEM, and SEM. No epitaxial cobalt disilicide was formed under any thermal treatment conditions.

Figure 9:
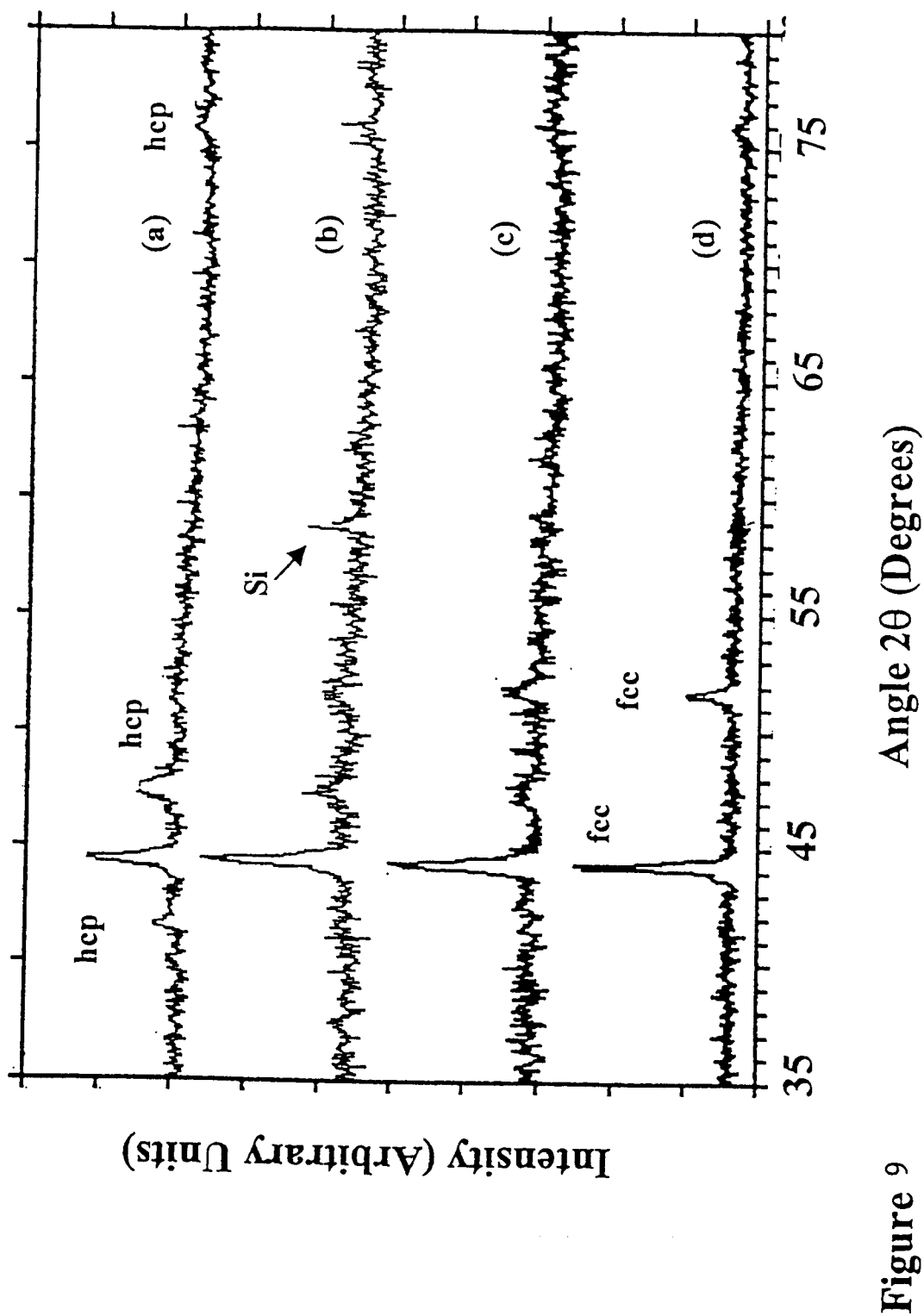
FIG. 9 is a representation of typical XRD patterns collected at low angle incidence for uncapped CVD Co films: (a) as-deposited, (b) annealed at 500° C. for 30 s, (c) annealed at 600° C. for 30 s, and (d) annealed at 700° C. for 30 s. No silicidation is detected. Instead, a transformation from hcp Co to fcc Co is observed upon annealing.

XRD analysis showed that the as-deposited hexagonal-close-packed (hcp) cobalt phase was transformed into a face-centered-cubic (fcc) cobalt phase. The graph is shown in FIG. 9. The curves represent (a) as deposited; (b) annealed at 500° C. for 30 seconds; (c) annealed at 600° C. for 30 seconds; and (d) annealed at 700° C. for 30 seconds. No XRD peaks corresponding to cobalt silicide or cobalt oxide phases were detected in any samples. Selective chemical etching of the annealed samples confirmed XRD findings with respect to the absence of any cobalt silicide phase. The 15-minute etch in 10% nitric acid completely removed the cobalt film from the substrates. RBS analysis of post-wet-etched samples showed that, within detection limits, no cobalt or cobalt silicide phases were present on the substrates.

Figure 10A:
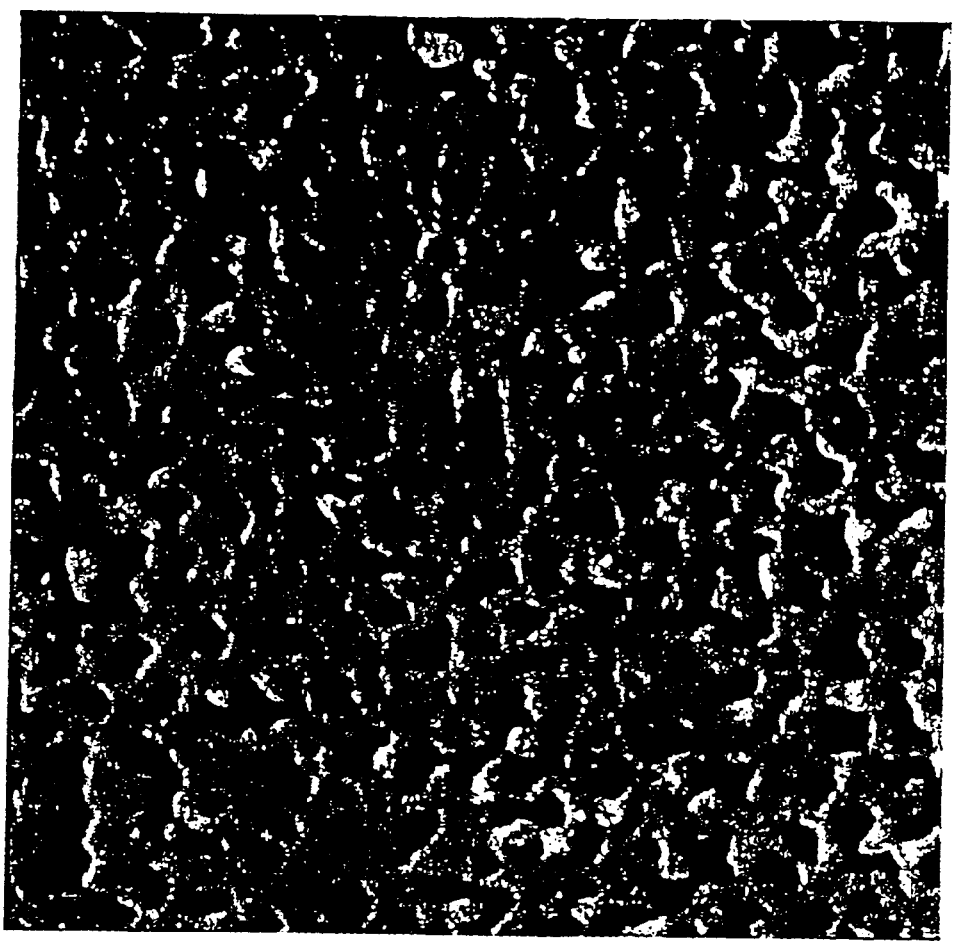
FIG. 10 is a representation of scanning electron microscopy (SEM) images of the surface morphology of uncapped CVD Co films on Si after annealing for 30 sec at: (a) 500° C., (b) 600° C., and (c) 700° C. No silicidation occurs. Instead, agglomeration of Co is observed, with the degree of agglomeration increasing with higher annealing temperature.
Figure 10B:
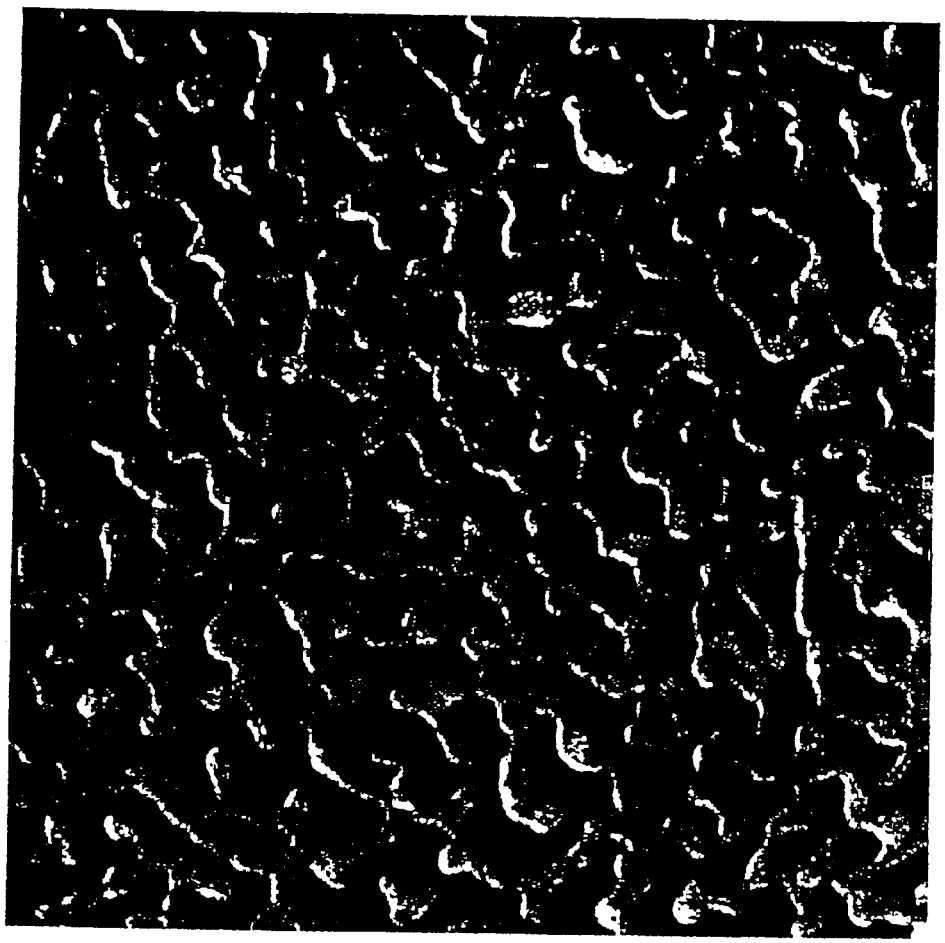
Figure 10C:
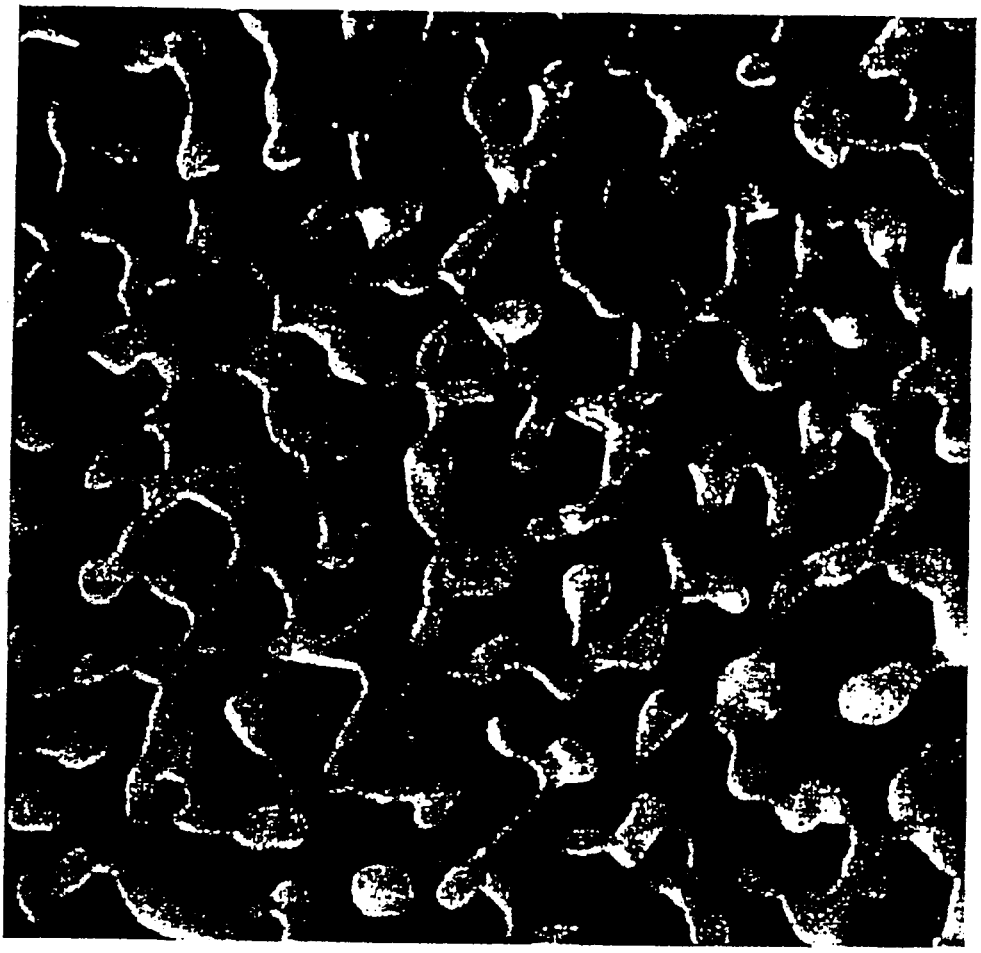

Prior to the wet etch step, all annealed samples were also analyzed by SEM in order to examine the evolution of film surface morphology. SEM analyses showed Co film agglomeration for all samples annealed at temperatures above 500° C. As an example, the SEM images of Co films annealed at 550° C., 600° C., and 700° C. for 30 sec are shown in FIG. 10. It is clearly seen that the degree of agglomeration increased with higher annealing temperature, and the Co film became practically discontinuous after the 600° C./30 sec anneal. The SEM results correlated well with the findings from the sheet resistance measurements. In particular, the initial decrease in the sheet resistance after the 500° C./30 sec anneal was attributed to Co grain coalescence and growth. The more severe Co film agglomeration occurring at higher annealing temperatures, leading to the formation of separate Co islands, resulted in the observed rapid increase of sheet resistance values.

Example 4
Failure to Form Epitaxial CoSi$_2$ from PVD Co Capped with Ti/TiN

Cobalt films having a thickness of (30±3 nm) were deposited by sputtering. As in the case of the cobalt CVD example, the samples were divided into two splits, one having a Ti/TiN cap and one without a cap. The cobalt film was capped with an overlayer of a 12 nm TiN layer over a 10 nm Ti layer as in Example 1, and the samples were annealed as described in Example 1. Selective etching steps were performed to remove Ti, TiN and unreacted cobalt. No epitaxial cobalt disilicide was formed under any thermal treatment conditions. Instead, XRD measurements indicated formation of a polycrystalline cobalt disilicide phase with a strong (200) texture. The structure of this cobalt disilicide phase was independent of the temperature and duration of annealing. Corresponding resistivity was ~(21.0±4.0 $\mu\Omega$cm).

Example 5
Failure to Form Epitaxial CoSi$_2$ from Uncapped PVD Co

Cobalt films having a thickness of (30±3 nm) were deposited by sputtering over a silicon substrate. No Ti/TiN cap was formed over the cobalt films. The samples were annealed as described in Example 1. No epitaxial cobalt disilicide was formed under any thermal treatment conditions. XRD indicated that a CoSi phase was formed after the 500° C., 30 second anneal, and that after the 600° C., 30 second anneal, the cobalt film was completely transformed into a randomly oriented polycrystalline cobalt disilicide phase, with diffraction peaks in excellent agreement with JCPDS PDF # 38-1449. XRD findings were supported by RBS and sheet resistance measurements, with the 100 nm-thick cobalt disilicide phase exhibiting sheet resistance and resistivity values of (2.0±0.3 $\Omega$/sq.) and (19±2 $\mu\Omega$cm), respectively.

What is claimed is:

1. A process for forming an epitaxial cobalt disilicide layer on a silicon substrate comprising:
    (a) vaporizing a cobalt source precursor;
    (b) decomposing said cobalt source precursor on the silicon substrate to form on the silicon substrate an ultrathin interfacial layer and a cobalt layer over the ultrathin interfacial layer;
    (c) forming, over the cobalt layer, a capping layer comprising at least one of a refractory metal, a refractory metal nitride, a refractory metal carbide, a binary nitride of a refractory metal, a binary carbide of a refractory metal, a ternary nitride of a refractory metal and a ternary carbide of a refractory metal; and
    (d) annealing at a temperature sufficiently high and for a period sufficiently long to form the epitaxial cobalt disilicide layer on the silicon substrate.

2. A process according to claim 1 wherein the cobalt source precursor is selected from cobalt tricarbonyl nitrosyl; cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl and acetylene dicobalt pentacarbonyl triethylphosphine.

3. A process according to claim 1 wherein the cobalt source precursor is cobalt tricarbonyl nitrosyl.

4. A process according to claim 1 wherein the refractory metal is chosen from titanium, tantalum, and tungsten.

5. A process according to claim 4 wherein the refractory metal is titanium.

6. A process according to claim 1 wherein the refractory metal nitride is titanium nitride.

7. A process according to claim 1 wherein the capping layer comprises titanium and titanium nitride.

8. A process according to claim 7 wherein the capping layer comprises a layer of titanium nitride over a layer of titanium.

9. A process according to claim 1 wherein the capping layer is formed by physical vapor deposition.

10. A process according to claim 1 wherein the silicon substrate is heated to a temperature ranging from 300° C. to 600° C. in order to decompose the cobalt source precursor on the silicon substrate.

11. A process according to claim 10 wherein the silicon substrate is heated to a temperature of about 390° C. in order to decompose the cobalt source precursor on the silicon substrate.

12. A process according to claim 1 wherein annealing is performed at a temperature ranging from about 700° C. to 1000° C.

13. A process according to claim 12 wherein annealing is performed at about 725° C.

14. A process according to claim 1 wherein annealing is performed for a period ranging from about 30 seconds to about 90 seconds.

15. A process according to claim 14 wherein annealing is performed for about 30 seconds.

16. A process according to claim 1 wherein the cobalt layer has a thickness of about 30 nm.

17. A process for forming an epitaxial cobalt disilicide layer on a silicon substrate comprising:
    (a) vaporizing a cobalt source precursor comprising cobalt tricarbonyl nitrosyl;
    (b) decomposing said cobalt source precursor on the silicon substrate to form on the silicon substrate an ultrathin interfacial layer and a cobalt layer over the ultrathin interfacial layer;
    (c) forming, over the cobalt layer, a capping layer comprising a layer of titanium nitride over a layer of titanium; and
    (d) annealing at a temperature of about 725° C. for a period of about 30 seconds.

18. An ALCVD process for the deposition of a layer comprising cobalt on a surface of a substrate in a deposition chamber, the process comprising the sequential steps of:
    (a) vaporizing a cobalt source precursor;
    (b) pulsing the cobalt source precursor into the deposition chamber;
    (c) contacting a surface of the substrate with the cobalt source precursor or a composition derived therefrom;
    (d) pulsing an inert gas into the deposition chamber; and
    (e) decomposing the cobalt source precursor or composition derived therefrom to form a layer comprising cobalt on the surface of the substrate.

19. An ALCVD process according to claim 18 additionally comprising the step of:
    pulsing a reactant gas into the deposition chamber;
    said step being performed after pulsing an inert gas into the deposition chamber and before decomposing the cobalt source precursor.

20. An ALCVD process according to claim 19 additionally comprising, after decomposing the cobalt source precursor, pulsing an inert gas into the deposition chamber.

21. An ALCVD process according to claim 18 wherein the substrate is heated to a temperature ranging from about 300° C. to about 600° C.

22. An ALCVD process according to claim 18 wherein the substrate is heated to a temperature of 390° C.

23. An ALCVD process according to claim 20 wherein the steps are performed repeatedly in sequence to form a plurality of cobalt layers on the substrate.

24. An ALCVD process according to claim 18 wherein the cobalt source precursor is selected from cobalt tricarbonyl nitrosyl, cobalt tetracarbonyl iodide, cobalt tetracarbonyl trichlorosilane, carbonyl chloride tris(trimethylphosphine) cobalt, cobalt tricarbonyl-hydrotributylphosphine, acetylene dicobalt hexacarbonyl and acetylene dicobalt pentacarbonyl triethylphosphine.

25. An ALCVD process according to claim 24 wherein the cobalt source precursor is cobalt tricarbonyl nitrosyl.

26. An ALCVD process according to claim 18 wherein the reactant gas is hydrogen.

27. An ALCVD process according to claim 18 wherein a carrier gas is pulsed into the deposition chamber with the cobalt source precursor.

28. An ALCVD process for forming an epitaxial cobalt disilicide layer on a silicon substrate, the process comprising the sequential steps of:

(a) vaporizing a cobalt source precursor;

(b) pulsing the cobalt source precursor into the deposition chamber;

(c) contacting a surface of the substrate with the cobalt source precursor or a composition derived therefrom;

(d) pulsing an inert gas into the deposition chamber;

(e) decomposing the cobalt source precursor or composition derived therefrom to form a layer comprising cobalt on the surface of the substrate;

(f) forming a capping layer comprising at least one of a refractory metal, a refractory metal nitride, a refractory metal carbide, a binary nitride of a refractory metal, a binary carbide of a refractory metal, a ternary nitride of a refractory metal and a ternary carbide of a refractory metal; and (g) annealing at a temperature sufficiently high and for a period sufficiently long to form an epitaxial cobalt disilicide layer.

29. An ALCVD process according to claim 28 wherein annealing is performed at a temperature ranging from about 700° C. to 900° C.

30. An ALCVD process according to claim 29 wherein annealing is performed at about 725° C.

31. An ALCVD process according to claim 28 wherein annealing is performed for a period ranging from about 30 seconds to about 180 seconds.

32. An ALCVD process according to claim 31 wherein annealing is performed for about 30 seconds.

33. An ALCVD process according to claim 28 wherein the cobalt layer has a thickness of about 30 nm.

* * * * *